United States Patent [19]

Nakamura

[11] Patent Number: 4,704,306

[45] Date of Patent: Nov. 3, 1987

[54] METHOD AND MASK FOR FORMING THIN FILM

[75] Inventor: Takeshi Nakamura, Nagaokakyo, Japan

[73] Assignee: Murata Manufacturing Co., Ltd., Japan

[21] Appl. No.: 824,631

[22] Filed: Jan. 31, 1986

[30] Foreign Application Priority Data

Mar. 20, 1985 [JP] Japan .............................. 60-40741[U]

[51] Int. Cl.⁴ ........................ C23C 13/08; C23C 15/00
[52] U.S. Cl. .................................... 427/100; 118/505; 118/721; 427/282; 204/298
[58] Field of Search ................ 118/505, 721; 204/298; 428/616; 427/282, 100, 248.1

[56] References Cited

U.S. PATENT DOCUMENTS

| | | | |
|---|---|---|---|
| 1,987,167 | 1/1935 | Valverde | 428/616 |
| 2,003,018 | 5/1935 | Spencer | 428/616 |
| 2,675,267 | 4/1954 | Vaughan | 428/616 |
| 3,170,810 | 2/1965 | Kagan | 118/505 X |

Primary Examiner—John P. McIntosh
Attorney, Agent, or Firm—Ostrolenk, Faber, Gerb & Soffen

[57] ABSTRACT

The invention relates to a mask for use in forming a thin film on a workpiece on which the thin film is to be formed, the mask comprising a member which flexes so that the center part of the mask projects toward the workpiece in the temperature range in which the thin film is formed.

11 Claims, 8 Drawing Figures

METHOD AND MASK FOR FORMING THIN FILM

BACKGROUND OF THE INVENTION

1. Field of the Invention

This invention relates to improvements in a mask used for forming a thin film having of a specified pattern, in dry type thin film forming methods such as sputtering, vapor deposition, ion plating and the like.

2. Prior Art

FIG. 3 is a sectional view illustrating a mask for use in vapor deposition, which is one example of a conventional thin film forming mask. A mask 1 is formed with openings 2 for forming a desired pattern. The mask 1 is generally made of a metal material such as stainless steel, which is excellent is corrosion resistance. In vapor deposition, as shown in FIG. 3, the mask 1 is placed on one surface of a workpiece 4 to be coated by vapor deposition and is fixed by bolts 5 and nuts 6 to the workpiece 4. The reason for this procedure is that in order to form a desired pattern exactly on the workpiece 4 by vapor deposition, it is necessary to secure the mask 1 positively to the entire surface of the workpiece 4 on which a thin film is to be formed.

The above prior art example relates to a mask 1 for use in vapor deposition. Similar thin film forming masks have been used as well in other dry type thin film forming methods such as sputtering, ion plating and the like.

The general practice is for the mask 1 to be heated together with the workpiece 4 at a temperature of 200° to 500° C. when a film is to be formed by dry type thin film forming methods such as sputtering, vapor deposition, ion plating and the like. Accordingly, as shown in section in FIG. 4, during the actual stage of thin film formation, a problem may occur in that this heating may flex the mask 1. Also, when the mask 1 is fastened to the workpiece 4 by bolts 5, an excessively strong fastening force exerted by the bolts may sometimes flex the mask 1. As a result, especially in the portion away from the bolts 5, the mask 1 may be considerably raised off the surface of the workpiece 4 on which a thin film is to be formed.

Although an increase in the number of bolts 5 improves adhesibility of the mask 1 to the work 4, on the other hand the increased number of bolts 5 reduces the effective area of vapor coating, resulting in reduction in productivity. Furthermore, attachment and removal of many bolts in each vapor deposition procedure reduces working efficiency, resulting in greater reduction in productivity.

On the other hand, in some cases the workpiece itself flexes. FIG. 5 is a plan view, and FIG. 6 is a sectional view taken along the line VI—VI in FIG. 5, illustrating an example of flexion of the workpiece itself. The structure shown in FIGS. 5 and 6 is a piezoelectric transducer in which a piezoelectric crystal thin film 8 made of zinc oxide (ZnO) is formed on an upper surface of a base material 7 such as Elinvar (trade name), and electrodes 9a and 9b are formed by a well-known thin film forming method. In constructing this piezoelectric transducer, during the time the ZnO thin film 8 is being formed on the upper surface of the base material 7 of Elinvar, the material 7 often flexes to project in the direction of the ZnO thin film 8 due to the grain growth of ZnO.

FIG. 7 is a schematic side view of an arrangement for forming the electrodes 9a and 9b, wherein a structure 10 including a ZnO thin film 8 formed on the upper surface of a base material 7, is placed on a support portion 10A, and the mask 1 is fixed to the upper surface of the support portion 10A. In this arrangement, it is difficult to form electrodes exactly in accordance with a desired pattern because the structure 10 itself, namely the workpiece to be treated, flexes as shown. Since in this case, unlike the case shown in FIGS. 3 and 4, the workpiece itself flexes and projects toward the mask 1, it becomes impossible to form electrodes in accordance with a desired pattern in the peripheral area of the workpiece, since the mask contacts primarily the central area of the workpiece.

The problems described above are not limited to a mask used in vapor deposition, but are likewise true of masks for use in other dry type thin film forming methods such as sputtering, ion plating and the like.

SUMMARY OF THE INVENTION

Accordingly, an object of this invention is to provide a thin film forming mask capable of correctly and positively forming a desired pattern, which is excellent in productivity and in working efficiency.

The problems described above are solved by the present invention, which provides a mask adapted to be attached to a workpiece on which a thin film is to be formed, the mask being characterized in that it comprises a member whose center portion flexes to project toward the workpiece in the temperature range in which the thin film is formed.

The member described above may be comprised of a bimetal or a shape memory alloy capable of being flexed in such a manner that the center portion of the mask projects toward the workpiece in the temperature range in which the thin film is formed.

As described above, the invention relates to a mask to be attached to the workpiece for use in forming a thin film on the workpiece. The mask comprises a member adapted to permit the center portion thereof to flex so as to project toward the workpiece in the temperature range in which the thin film is formed. Thus, the thin film forming mask is positively brought into firm contact with the surface of the workpiece on which the thin film is formed and which therefore can precisely and positively form a thin film having a desired pattern.

Furthermore, since the invention makes it unnecessary to increase the area of a portion physically fixed, as by bolts or the like, in comparison with a conventional thin film forming mask, there is no possibility of productivity being reduced nor any complicated work being required. Accordingly, it is possible to correctly form a thin film having a desired pattern by entirely the same manufacturing procedures as in conventional manufacturing.

The invention can be generally applied to thin film forming masks for use with dry type thin film forming methods such as vapor deposition, sputtering, ion plating and the like.

These objects and other objects, features, aspects and advantages of the present invention will become more apparent from the following detailed description of preferred embodiments of the present invention when taken in conjunction with the accompanying drawings.

DESCRIPTION OF THE PREFERRED EMBODIMENTS

Figure 1:
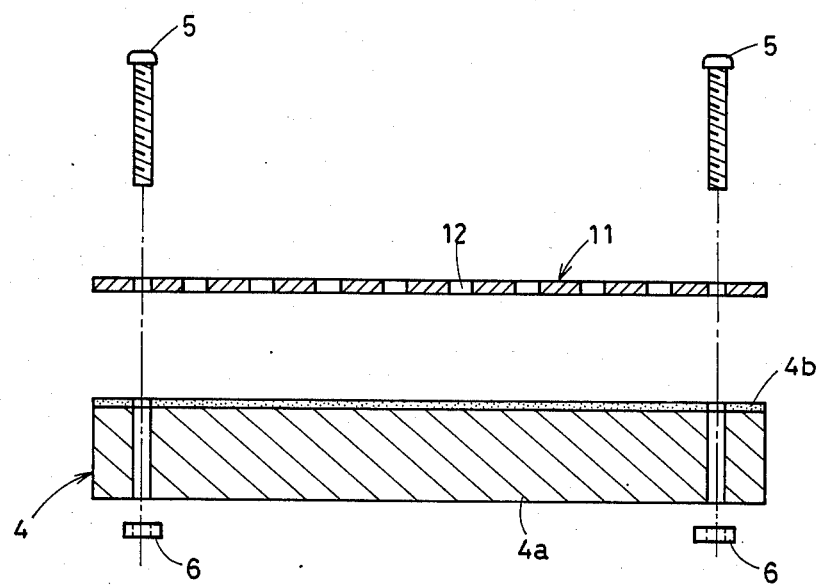
FIG. 1 is a sectional view illustrating an embodiment of the invention.

FIG. 1 is a sectional view showing an embodiment of the invention. A central characteristic feature of a mask 11 for forming a thin film of the embodiment of the invention is that the mask 11 is made of a bimetal capable of being flexed so as to permit the center portion of the mask 11 to project toward one side in the temperature range in which the thin film is formed.

In forming a thin film according to dry type thin film forming methods such as sputtering, vapor coatings, ion plating and the like, a workpiece to be treated and a thin film forming mask are generally heated to the temperature range of 200° to 500° C. Accordingly, it is advantageous to construct the mask 11 in such a manner that the center of the mask 11 projects toward one side in such a temperature range.

Figure 3:
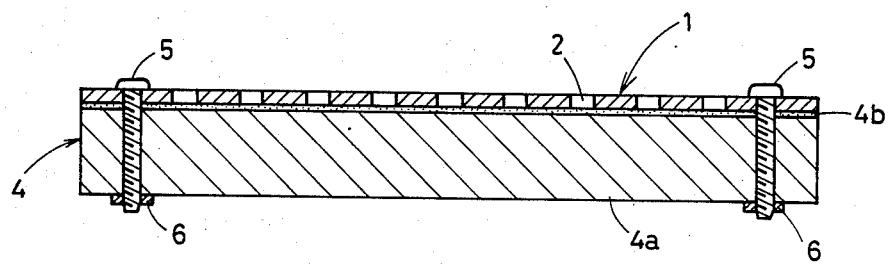
FIG. 3 is a sectional view illustrating one example of a conventional mask used for forming a thin film.

The mask 11 has openings 12 for forming a specified pattern in a similar manner as with the conventional mask 1 shown in FIG. 3. Also, the mask 11 is fixed to the work by bolts 5 and nuts 6 as shown. In the embodiment illustrated, it is not contemplated that the workpiece 4 will flex. The workpiece 4 is comprised of a base member 4a and a thin film layer 4b coated on the upper face of the member 4a. In this example, electrodes having a specified pattern are to be formed by vapor deposition on the thin film layer 4b by the use of the mask 11.

Figure 1A:
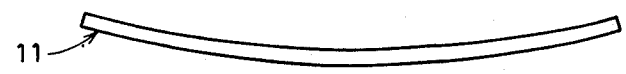
FIG. 1A is a sectional view showing the embodiment of FIG. 1 during the process of film formation.

The thin film forming mask 11 shown in FIG. 1, as described above, is comprised of a bimetal whose center portion projects toward one side in the temperature range of thin film formation. Accordingly, if the mask 11 is so arranged as to project toward the workpiece 4, the mask deforms as shown in FIG. 1A in the range of temperature in which the thin film is formed, and thus the center portion of the mask can positively be brought into firm contact with the thin film 4b on the upper face of the workpiece 4.

Figure 4:
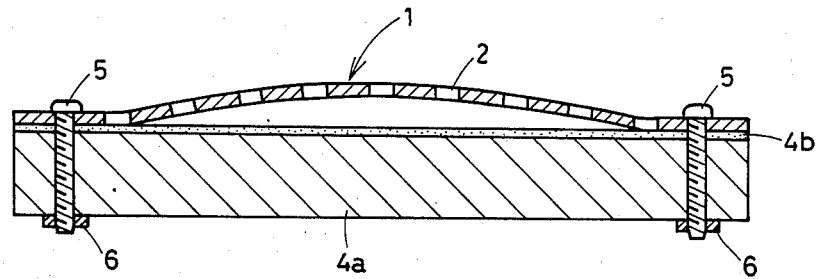
FIG. 4 is a sectional view illustrating the disadvantages of the mask shown in FIG. 3.

Accordingly, the problems related to the flexion of a conventional thin film forming mask 1 as shown in FIG. 4 are completely solved. That is, in the temperature range in which the thin film is formed, the mask 11 does not flex so as to move away from the workpiece. Even if the tightening force due to bolts 5 or the like is too great, the mask 11 is free from similar deflection form the work. Accordingly, the bolts 5 and the like are allowed to be more tightly fastened, with the result that the mask can be positively brought into contact with the workpiece 4 not only centrally but also peripherally. Accordingly, a thin film having a desired pattern can be positively formed.

In the embodiment illustrated, a description has been given of the case wherein the workpiece 4 is flat, that is the workpiece 4 itself does not flex, but the above embodiment may be also effectively used in a case, as described above with reference to FIGS. 5 to 7, in which the workpiece itself flexes when the thin film is formed.

Figure 5:
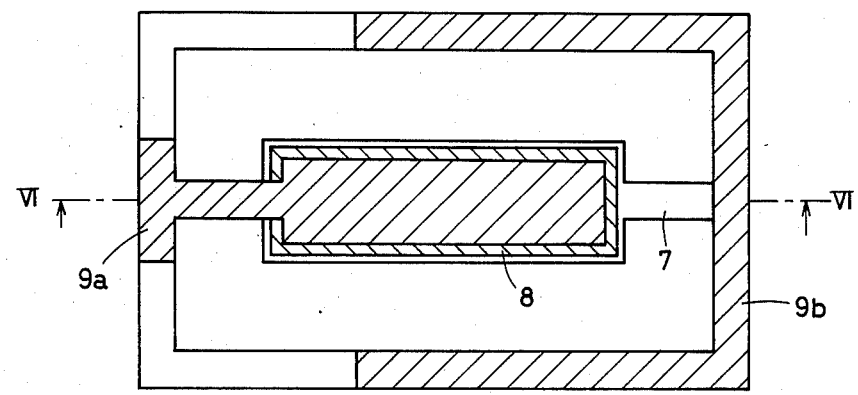
FIG. 5 is a plan view showing one example of a structure in which the workpiece itself flexes during thin film formation and to which the invention may be advantageously applied.
Figure 6:
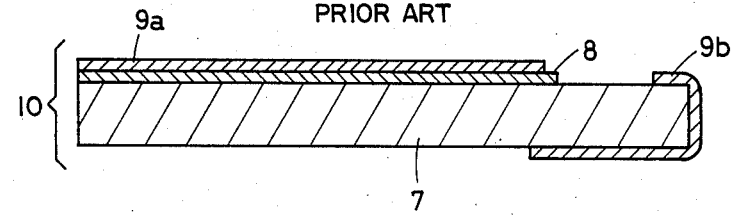
FIG. 6 is a sectional view taken along the line VI—VI of FIG. 5.
Figure 7:
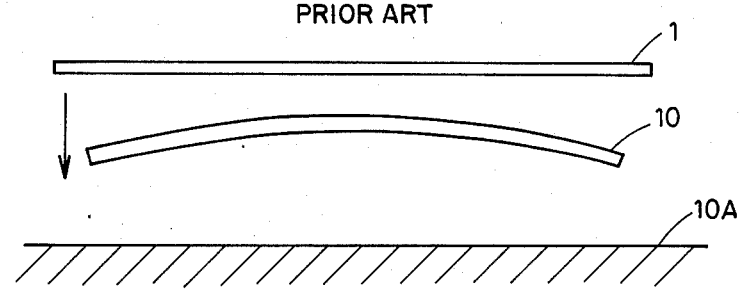
FIG. 7 is a schematic side view illustrating problems relative to forming a thin film on the structure shown in FIGS. 5 and 6.

Namely, in the structure wherein a ZnO piezoelectric thin film 8 is formed on a base member 7 consisting of Elinvar as shown in FIGS. 5 to 7, the structure flexes such that the center thereof projects twoard the ZnO piezoelectric thin film. In this embodiment, as described above, the center of the mask 11 projects toward the workpiece. Thus the mask 11 can also be used effectively with a workpiece whose center portion, as shown in FIGS. 5 and 6, flexes to project toward the mask.

As described above, the mask 11 may be formed of a bimetal, but instead of the bimetal, the mask may be formed of a shape memory alloy. In this case, a member is used which is made of a shape memory alloy which is treated to be flat at a normal temperature but is changeable into the shape shown in FIG. 1A in the temperature range of thin film formation. Usable as such shape memory alloys are various known shape memory alloys such as Ni-Ti-based, Cu-Zn-Al-based alloys and the like.

Figure 2:
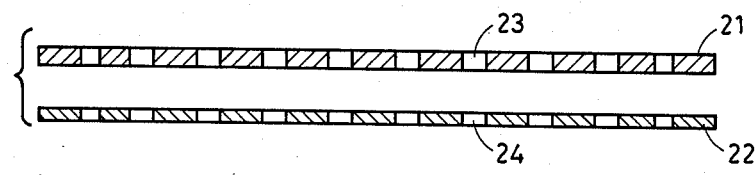
FIG. 2 is a sectional view illustrating another embodiment of the invention.

Also, as shown in sectional view in FIG. 2, a mask having two layers can be used. That is, it is possible to prevent the raising of the mask when the thin film is formed by disposing a first mask 22 on the workpiece side so as to be sandwiched between a second mask 21 and the workpiece; a second mask 21 being used as the member whose center portion deforms to project toward the work in the temperature range of thin film formation. In this case, it is not always necessary to bring the openings 24 of the first mask 22 into exact register with the openings 23 of the second mask 21 as shown. That is, the openings 24 of the first mask 22 may be formed according to a desired pattern, while the openings 23 of the second mask 21 may be constructed so as to be larger than and surround the openings 24. Here, the second mask 21 constitutes the mask for forming a thin film of the invention. In other words, it is pointed out that the mask of the invention is broadly defined as a covering used in forming a thin film and is not always directly intended to be used for forming a pattern.

Although embodiments of the present invention have been described and illustrated in detail, it is clearly understood that the same is by way of illustration and example only and is not to be taken by way of limitation, the spirit and scope of the present invention being limited only by the terms of the appended claims.

What is claimed is:

1. In a film forming apparatus, including a support for a workpiece, a film forming material source for forming a film on a workpiece located on the support, a mask for being located to mask portions of the workpiece not intended to have a film formed thereon, and means for heating the mask and the workpiece to a film forming temperature, the improvement comprising a mask for use in forming such film on such workpiece, said mask comprising a member which flexes so as to cause the mask to bulge in the temperature range in which the apparatus forms the film on the workpiece, but not at ambient temperatures, and means for attaching the mask to the workpiece so that said mask bulges toward the workpiece and is held in contact therewith.

2. A mask according to claim 1 wherein said member is made of a bimetal.

3. A mask according to claim 1 wherein said member is made of a shape memory alloy.

4. A mask according to claim 1, wherein said member has at least one opening therein for defining a thin film pattern on the workpiece.

5. A mask according to claim 1, further comprising a second member arranged to be sandwiched between said first-mentioned member and the workpiece, said second member having at least one opening therein for defining a thin film pattern on the workpiece, and said first-mentioned member having an opening in register with the opening in said second member.

6. A mask according to claim 5, wherein the opening in the first-mentioned member is larger than and surrounds the opening in the second member.

7. A method of forming a thin film on a workpiece, comprising the steps of:
(a) providing a mask having a portion which bulges in the temperature range in which the thin film is to be formed on the workpiece, but not at ambient temperatures,
(b) attaching the mask to the workpiece so that said portion will bulge toward the workpiece and be held in contact therewith, and
(c) forming the thin film on the workpiece by employing the mask in a dry type thin film forming method in said temperature range.

8. A method as in claim 7, including providing a member in the mask which flexes so as to cause said mask portion to bulge in said temperature range.

9. A method as in claim 8, including providing at least one opening in the member for defining a thin film pattern on the workpiece.

10. A method as in claim 9, including arranging a second member sandwiched between said first-mentioned member and the workpiece, providing at least one opening in the second member for defining a thin film pattern on the workpiece, and providing an opening in the first-mentioned member in register with the opening in the second member.

11. A method as in claim 10, including making said opening in the first-mentioned member larger than and surrounding the opening in the second member.

* * * * *